(12) United States Patent
Ge

(10) Patent No.: US 10,802,994 B1
(45) Date of Patent: Oct. 13, 2020

(54) CALIBERATING A PLURALITY OF CONDUCTANCES OF COLUMNS IN MEMRISTOR CROSSBAR BASED COMPUTING

(71) Applicant: TETRAMEM INC., Newark, CA (US)

(72) Inventor: Ning Ge, Newark, CA (US)

( * ) Notice: Subject to any disclaimer, the term of this patent is extended or adjusted under 35 U.S.C. 154(b) by 0 days.

(21) Appl. No.: 16/242,660

(22) Filed: Jan. 8, 2019

(51) Int. Cl.
*G06F 13/00* (2006.01)
*G06F 13/12* (2006.01)
*G11C 7/10* (2006.01)
*G11C 8/00* (2006.01)

(52) U.S. Cl.
CPC .......... *G06F 13/122* (2013.01); *G11C 7/1051* (2013.01); *G11C 7/1096* (2013.01); *G11C 8/00* (2013.01)

(58) Field of Classification Search
CPC .................................................. G06F 13/122
See application file for complete search history.

(56) References Cited

U.S. PATENT DOCUMENTS

| | | | |
|---|---|---|---|
| 10,127,494 B1* | 11/2018 | Cantin | G06N 3/0445 |
| 10,380,386 B1* | 8/2019 | Strachan | G06G 7/16 |
| 2015/0278682 A1* | 10/2015 | Saxena | G06N 3/049 706/23 |
| 2017/0229170 A1* | 8/2017 | Ge | G11C 13/004 |
| 2019/0205741 A1* | 7/2019 | Gupta | G06F 9/3853 |

* cited by examiner

Primary Examiner — Tammara R Peyton

(57) ABSTRACT

Systems and methods for improving the accuracy of computing in a crossbar-based computing environment are disclosed. In some implementations, an apparatus comprises: a first column of crossbar devices; a second column of crossbar devices; a plurality of analog to digital converters (ADCs) configured to receive an input signal from the first column of crossbar devices and the second column of crossbar devices; a selector configured to switch the input signal between the first column of crossbar devices and the second column of crossbar devices; and a CPU configured to calculate a first conductance of the first column of crossbar devices and a second conductance of the second column of crossbar devices, wherein the selector is configured to switch the signals between the first column of crossbar devices and the second column of crossbar devices in accordance with the first conductances and the second conductances.

13 Claims, 4 Drawing Sheets

CALIBERATING A PLURALITY OF CONDUCTANCES OF COLUMNS IN MEMRISTOR CROSSBAR BASED COMPUTING

TECHNICAL FIELD

The present disclosure generally to improving computing accuracy on a memristor crossbar and more specifically to software- and hardware-based technologies to calibrate memristor crossbar.

BACKGROUND

Traditionally, a crossbar array may include horizontal metal wire rows and vertical metal wire columns (or other electrodes) intersecting with each other, with crossbar devices formed at the intersecting points. The crossbar array may be used in non-volatile solid-state memory, signal processing, control systems, high-speed image processing, neural network, and other applications. A memristor is a two-terminal passive device capable of changing resistance upon sufficient electrical stimulations, which have attracted significant attention for high-performance nonvolatile memory applications. However, defects and parasitic in crossbar arrays degrade the accuracy of crossbar-based computing.

Technical challenges therefore remain for reducing potential defects and their negative impacts on performance, and for striking a balance between cost and performance.

SUMMARY

Systems and methods for improving computing accuracy on a memristor crossbar array are disclosed. In some implementations, an apparatus comprises: a first column of crossbar devices; a second column of crossbar devices; a plurality of analog to digital converters (ADCs) configured to receive an input signal from the first column of crossbar devices and the second column of crossbar devices; a selector configured to switch the input signal between the first column of crossbar devices and the second column of crossbar devices; and a CPU configured to calculate a first conductance of the first column of crossbar devices and a second conductance of the second column of crossbar devices, wherein the selector is configured to switch the signals between the first column of crossbar devices and the second column of crossbar devices in accordance with the first conductances and the second conductances.

In some implementations, the apparatus further comprises a storage configured to save signals from the plurality of ADCs.

In some implementations, the selector is further configured to switch in accordance with a determination of which conductance of a column of crossbar devices approximates to an optimal conductance.

In some implementations, the optimal conductance is an average conductance of the first conductance and the second conductance.

In some implementations, the apparatus further comprises a plurality of columns of crossbar devices, wherein the first column of crossbar devices and the second column of crossbar devices are located at a farthest end of the plurality of columns of crossbar devices away from the input signal.

In some implementations, at least one crossbar device in the plurality of first column of crossbar devices and the plurality of second column of crossbar devices is one of: a memristor, a memristive, a floating date, a phase change device, a Resistive Random-Access Memory (RRAM or ReRAM), a Magnetoresistive Random-Access Memory (MRAM), a Dynamic random-access memory (DRAM), and a Static Random-Access Memory (static RAM or SRAM).

In some implementations, the selector comprises a multiplexer or a transistor.

In some implementations, a method comprises: selecting a plurality of reading voltage as an input signal before programming an apparatus, wherein the apparatus includes: a crossbar array configured to receive the input signal, wherein the crossbar array comprises: a first column of crossbar devices; using a conversion algorithm to find a mapping conductance G', that I=VOG=crossbarsim(G', V); calculating a plurality of mapping conductance G' of the first column of crossbar devices based on the plurality of reading voltage; calculating an average mapping conductance Gavg, that Gavg=average(G'1, G'2, . . . , G'n); programming the crossbar array with a programming signal calibrated with the average mapping conductance Gavg; and using the crossbar array for computing.

In some implementations, the crossbar array in the method further comprises: a second column of crossbar devices; and wherein the apparatus further comprises: a plurality of analog to digital converters (ADCs) configured to receive the input signal from the first column of crossbar devices and the second column of crossbar devices; a selector configured to switch the input signal between the first column of crossbar devices and the second column of crossbar devices; and a CPU configured to calculate a first conductance of the first column of crossbar devices and a second conductance of the second column of crossbar devices, wherein the selector is configured to switch the signals between the first column of crossbar devices and the second column of crossbar devices in accordance with the first conductances and the second conductances.

In some implementations, the first conductance of the first column of crossbar devices is calibrated for input range 0 to max(sum(x))/2, and the second conductance of the second column of crossbar devices is calibrated for input range max(sum(x))/2 to max(sum(x)), wherein the sum(x) is a summation of an input vector of the input signal.

In some implementations, a non-transitory computer-readable storage medium storing one or more programs, the one or more programs comprising instructions, which when executed by a computing system with one or more processors, cause the computing system to execute a method of: selecting a plurality of reading voltage as an input signal before programming an apparatus, wherein the apparatus includes: a crossbar array configured to receive the input signal, wherein the crossbar array comprises: a first column of crossbar devices; using a conversion algorithm to find a mapping conductance G', that I=VOG=crossbarsim(G', V); calculating a plurality of mapping conductance G' of the first column of crossbar devices based on the plurality of reading voltage; calculating an average mapping conductance Gavg, that Gavg=average(G'1, G'2, . . . , G'n); programming the crossbar array with a programming signal calibrated with the average mapping conductance Gavg; and using the crossbar array for computing.

In some implementations, the crossbar array in the non-transitory computer-readable storage medium further comprises: a second column of crossbar devices; and the apparatus further comprises: a plurality of analog to digital converters (ADCs) configured to receive the input signal from the first column of crossbar devices and the second column of crossbar devices; a selector configured to switch the input signal between the first column of crossbar devices and the second column of crossbar devices; and a CPU configured to calculate a first conductance of the first column of crossbar devices and a second conductance of the second column of crossbar devices, wherein the selector is configured to switch the signals between the first column of crossbar devices and the second column of crossbar devices in accordance with the first conductances and the second conductances.

In some implementations, the first conductance of the first column of crossbar devices in the non-transitory computer readable storage medium is calibrated for input range 0 to max(sum(x))/2, and the second conductance of the second column of crossbar devices in the non-transitory computer readable storage medium is calibrated for input range max(sum(x))/2 to max(sum(x)), wherein the sum(x) is a summation of an input vector of the input signal.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Systems and methods for enhancing computing accuracy in a crossbar array are provided. The technologies described in the present disclosure may provide the following technical advantages. First, due to the circuit parasitics and defects, realistic crossbar does not perform perfect matrix multiplication. By utilizing the software or/and hardware design in the crossbar array may improve the accuracy of computing by compensating signal loss caused by circuit parasitic, mitigating the circuit parasitic and defects in the crossbar array.

Second, in a memristor crossbar-based computing, the crossbar itself is inexpensive and has a low power consumption, where the peripheral circuits, including DAC, ADC, buffers, ALUs, and control units are relatively expensive and require greater power consumption to compensate the influence of the parasitics and defects. Therefore, using methods involving analog compensation circuits are usually more costly than software- and/or hardware-based crossbar design methods. The systems and methods described in the present disclosure may mitigate circuit parasitics and defects in the crossbar array at a much lower cost.

Third, the technologies disclosed using distributed software-based and/or hardware-based computing techniques may be adjusted in accordance with different sizes of the crossbar arrays rather than a fixed method of compensating the circuit parasitics and defects. This increases flexibility for circuit designers to implement the systems and methods described in the present disclosure according to their applications.

Figure 1:
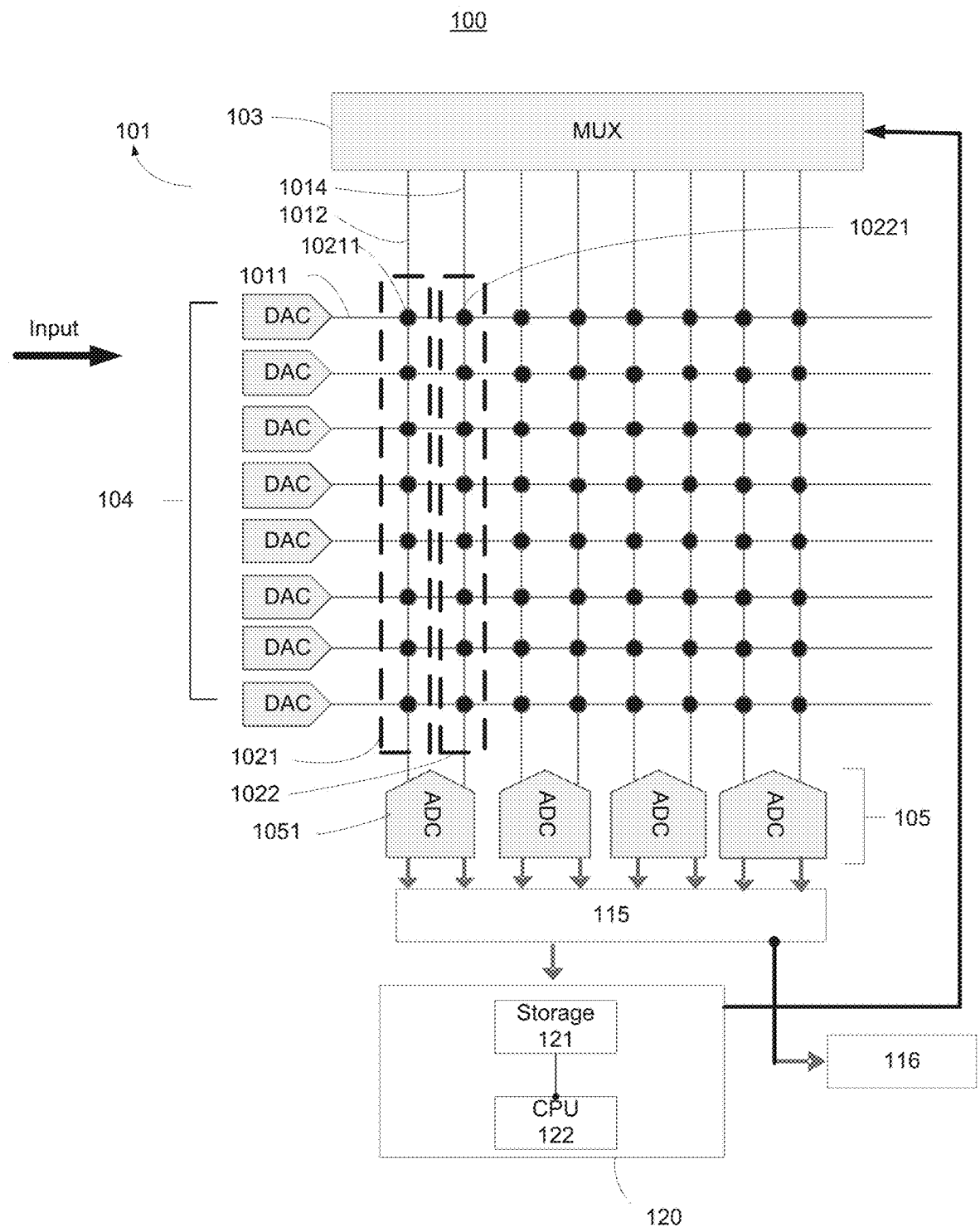
FIG. 1 is a block diagram illustrating an example crossbar array circuit in accordance with some implementations.

FIG. 1 shows a crossbar array circuit 101. A general crossbar array circuit is a circuit structure that has multiple horizontal row metal wires and vertical column metal wires intersecting with each other, with crossbar (or crossbar) devices formed at the intersecting points. The conductance of the crossbar device can be tuned by applying large enough voltage/current signal across it, and a crossbar device can be a memristor, floating date, phase change device, SRAM, or other devices. A crossbar array circuit can be used for parallel weighted current summation: By applying input signal at horizontal rows of the crossbar, the input signal V are weighted at each crossbar device by its conductance G through Ohm's law, and weighted current I are accumulated per column wires through Kirchhoff's Current Law. Overall, in an idea memristor crossbar, I=VG.

Crossbar's physical weighted current summation feature I=VG implies it can be used for vector-matrix multiplication Y=XA. To do it, first, a mapping between physical parameters to mathematical variables. One thing is notice is that matrix A may contain positive and negative values, but device conductance G can only be positive.

Input data vector X is converted to row input signal vector V by:

$$V=c*X$$

where c is a scalar.

Matrix A is shifted to all positive by a large enough scalar b, so that A+b is positive and every entry of A+b can be mapped to a single device, so that G=aA+b, a and b are scalars. Since $$I=VG=c*X*(aA+b)=a*c*XA+c*X*b*J=a*c*XA+c*b*\text{sum}(X),$$

where J is an all-ones matrix, means every entry of J is 1, we can derive Y as below:

$$Y=(I-c*b*\text{sum}(X))/(a*c).$$

Therefore, first, to computer matrix A that contains negative values on a single memristor crossbar with positive-only conductance, to pre- or post-compute sum(X) with the additional digital hardware is important. It argues to be the most efficient way, since addition is very cheap, and other methods involving analog compensation circuits are usually more costly.

Second, to convert I to Y, calculating with a few fitting parameters is needed. These fitting parameters can be the merged fitting parameters. It means combining the fitting parameters for different purposes together, including fitting parameters for I to Y conversion, parasitic mitigation, defect mitigation and so on is workable.

However, a problem on existing computing with large-scale memristor crossbar is the low accuracy. Due to circuit parasitics, including device nonlinearity, wire resistance, I/O resistance, sensing circuit noise, thermal noise and others, realistic crossbar does not perform perfect vector-matrix multiplication. For example, if linear map a matrix A to conductance G in a 128×128 crossbar, a lower than 3-4 bit-accuracy is hard to achieve.

Software-based compensation method such as a conversion algorithm may be implemented to mitigating the parasitics or defects. In an original conversion algorithm, it calculates Vcal⊙G=CrossbarSim(Vcal, G') to find a new mapping G' with consideration of circuit parasitics to replace the ideal linear mapping G. CrossbarSim is the circuit model with consideration of circuit parasitics. ⊙ means element-wise multiplication. By carefully choosing the one calibrating signal, the overall distribution of error regarding different input patterns can be close to a Gaussian distribution. However, the distribution of error for the data of error vs sum(X) is bell-shaped. Although the overall error follows a Gaussian distribution, the specific error per input pattern depends on the specific input pattern, so say sum(X). The source of bell-shaped error distribution is because only one signal is calibrated.

The present disclosure including the methods to further improve the accuracy with software and/or hardware co-design provides at least two ways to mitigate parasitics and defects.

A. Use Redundant Crossbar Columns to Optimize for Different Input Ranges

Circuit parasitics and defects have a negative impact when the conductance at which a device becomes un-tunable or contain an extremely high or low conductance differs from a target conductance or resistance. For instance, a crossbar device, when operational, may have a target resistance ranging from 2 KΩ to 2 MΩ. On the other hand, when the crossbar device becomes defective and has a non-tunable resistance of 500 KΩ, the crossbar device cannot be tuned to provide a 10KΩ resistance, regardless how much voltage or current is applied.

For memristor crossbar-based computing, the crossbar itself is very cheap and with low power consumption, where the peripheral circuit, including DAC, ADC, buffers, Arithmetic Logic Units (ALUs), and control units are expensive and consume additional power. Therefore, a circuit design that helps to improve the computing accuracy with certain circuit overhead, and that this circuit overhead not requiring additional DACs, ADCs is highly appreciated.

As FIG. 1 shows, a plurality of column wire such as a first column wire 1012 and a second column wire 1014, a plurality of crossbar devices such as a first crossbar device 10211 and the second crossbar device 10221 are implemented. The additional column of 1T1M devices is to optimize for different input ranges. These two columns will not be used at the same time. Benefit from this circuit, there will be two version of conductance G'. In some implementations, one is calibrated for input range from 0 to max(sum (x))/2, the other is calibrated for input range from max(sum (x))/2 to max(sum(x)). Since the sum(x) should be pre-calculated, by selecting the corresponding circuit with G' optimized for the range of sum(x), a better computing accuracy may be achieved.

In some implementations, the crossbar device may be of a 1-Transistor-1-Resistor (1T1R) structure, a 1-Selector-1-Resistor (1S1R) structure, or a 2-Resistor (2R) structure. The crossbar device may be one of: a memristor, a memristive device, a Pulse-Code Modulation (PCM) device, a floating date, a Phase Change Random Access Memory (PCRAM) device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

In some implementations, the conductance of an operational crossbar device may be arbitrarily tuned between a Low Resistance State (LRS) and a High Resistance State (HRS). In some implementations, the row wires, column wires, or both, are metal wires.

An input signal (which may be a reading signal or a programming signal) reaches the first row wire 1011, after entering from the crossbar array circuit 101 through a first converter array 104 (e.g., a Digital to Analog Converter (DAC) array). The current may then flow through the first operational crossbar device 10211 and the second crossbar device 10221. After leaving the second converter array 105 (e.g., an Analog to Digital Converter (ADC) array), the current is outputted to a calculation module 120 and to the output 116.

(1) Redundant Crossbar Columns Design

The first column of crossbar devices 1021 and the second column of crossbar devices 1022 are two columns of crossbar devices that are connected to the same ADC (e.g., ADC 1051). Therefore, it is easier to implement the function of separated input range for calibration that only one between the first column 1021 or the second column 1022 may be selected to send out the signal to the ADC and output the signal.

In some implementations, the two columns may be connected to the same channel connecting to the ADC.

Also, the first column of crossbar devices 1021 and the second column of crossbar devices 1022 are connected to the selector 103. The selector 103 is used to switch the input signal between the first column of crossbar devices 1021 and the second column of crossbar devices 1022. The two columns of crossbar devices are mutually and exclusively selected by the selector 103. Therefore, these two columns will not be used at the same time.

In some implementations, the selector 103 includes a multiplexer or a transistor to control the access of the columns.

(2) Calculation Module Design

After a current signal is outputted to the calculation module 120, the data received from the ADC array is saved in a storage 121 in the calculation module 120.

And then, a CPU 122 is provided to calculate a first conductance G1 of the first column of crossbar devices 1021 and a second conductance G2 of the second column of crossbar devices 1022. After the calculation, an instruction or order will be sent to the selector 103. The selector 103 is able to switch the input signals between the first column of crossbar devices 1021 and the second column of crossbar devices 1022 in accordance with the first conductances G1 and the second conductances G2. To be more specific, the selector 103 is further configured to switch in accordance with a determination of which conductance of a column of crossbar devices approximates to an optimal conductance Gopt. In some implementations, the optimal conductance Gopt is an average conductance of the first conductance G1 and the second conductance G2.

Figure 2:
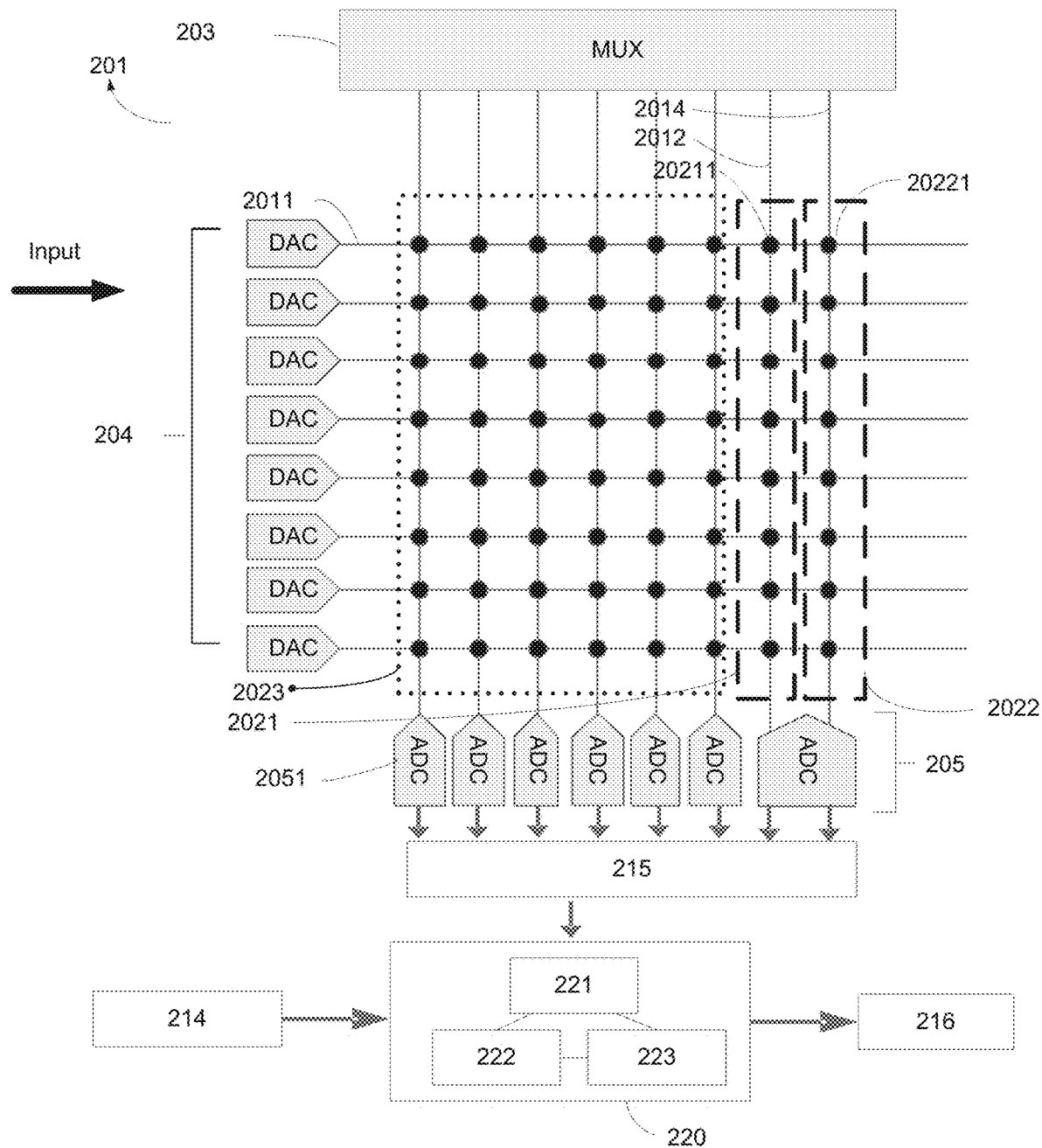
FIG. 2 is a block diagram illustrating an example crossbar array circuit with defects and parasitic in accordance with some implementations.

FIG. 2 shows a modified version in accordance with the embodiments of the present disclosure. As shown in FIG. 2, there is only one or a plurality columns (e.g $7^{th}$ column 2021 and $8^{th}$ column 2022 in an 8×8 crossbar array) using a redundant design of the present disclosure. The $7^{th}$ column of crossbar devices 2021 and the $8^{th}$ column of crossbar devices 2022 are located at a farthest end of the plurality of columns of crossbar devices 2023 away from the input signal and the DAC 204. It should be noted that the redundant design is not limited to an 8×8 crossbar circuit. It may be implemented in any large-scale crossbar circuit (e.g. 16×16, 32×32, 64×64, 128×128 etc.) especially for those columns that contain or accumulate high circuit parasitics which are those who located far away from the input signals. Therefore, a farthest 32 column of crossbar devices may implement the redundant design and leave the rest of the 32 column of crossbar devices intact in a 128×64 crossbar array.

Figure 3:
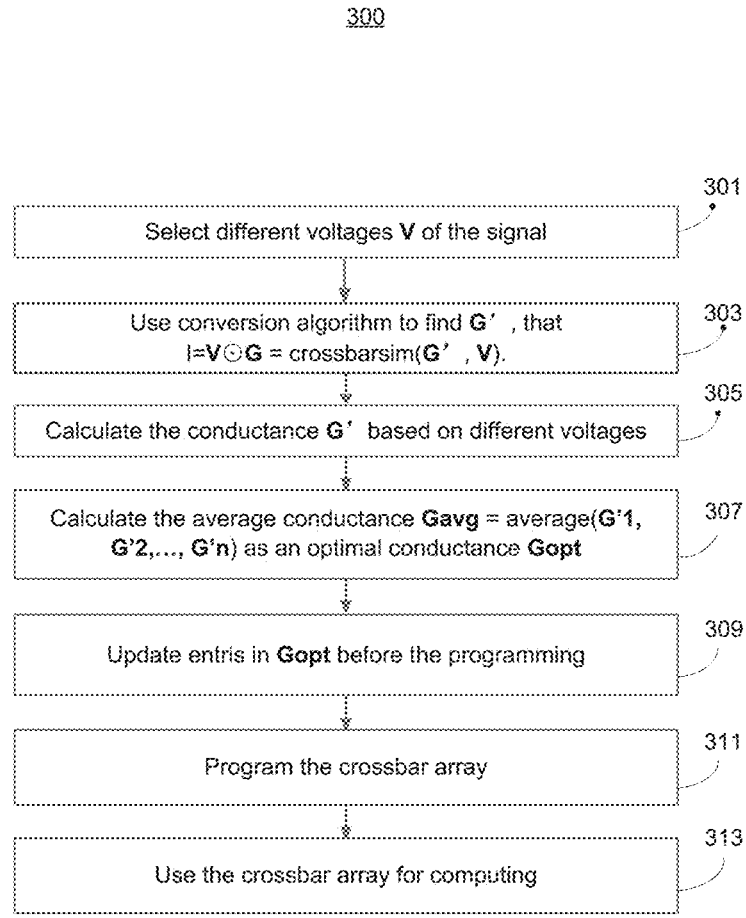
FIG. 3 is a flowchart illustrating an example method for mitigating circuit parasitics and defects in a crossbar-based computing environment in accordance with some implementations.

B. Use More than One Calibration Signals to Optimize the Circuit to the Average Input Range Rather than a Single Corner of Inputs FIG. 3 is a flowchart illustrating an example method 300 to for mitigating parasitics and defect in a crossbar-based computing environment in accordance with some implementations.

As mentioned before, the source of bell-shaped error distribution is because only one signal is calibrated. Therefore, one way to improve computing accuracy is to calibrate with more than one calibration signals, and then choose the average result of G'.

Therefore, the method 300 includes, selecting a plurality of reading voltage as an input signal before programming an apparatus (step 301). The apparatus includes: a crossbar array (e.g. crossbar array 101 shown in FIG. 1) configured to receive the input signal, and the crossbar array includes a first column of crossbar devices (e.g. the first column of crossbar devices 1021 shown in FIG. 1).

The method 300 further includes using a conversion algorithm to find a mapping conductance G', that I=VOG=crossbarsim(G', V) (step 303).

And then, calculate a plurality of mapping conductance G' of the first column of crossbar devices with the conversion algorithm based on the plurality of reading voltage (step 305).

Next, calculate an average mapping conductance Gavg, that Gavg=average(G'1, G'2, ..., G'n) (step 307).

And then, program the crossbar array with a programming signal calibrated with the average mapping conductance Gavg (step 309).

Finally, use the crossbar array for computing (step 311).

In some implementations, the different mapping conductance G' may be saved in a storage (e.g. storage 121) such that a CPU (e.g. CPU 122) may calculate and determine the best-fitting mapping conductance G' to be mapped and calibrated the programming signal with the best-fitting mapping conductance G'.

In some implementations, the crossbar array in the method 300 further includes: a second column of crossbar devices (e.g. the second column of crossbar devices 1022 shown in FIG. 1); and the apparatus further includes: a plurality of ADCs (e.g. ADCs 1051) configured to receive the input signal from the first column of crossbar devices and the second column of crossbar devices, a selector (e.g. selector 103) configured to switch the input signal between the first column of crossbar devices and the second column of crossbar devices; and the CPU (e.g. CPU 122) configured to calculate a first conductance of the first column of crossbar devices and a second conductance of the second column of crossbar devices. The selector is configured to switch the signals between the first column of crossbar devices and the second column of crossbar devices in accordance with the first conductances and the second conductances.

In some implementations, the first conductance of the first column of crossbar devices is calibrated for input range 0 to max(sum(x))/2, and the second conductance of the second column of crossbar devices is calibrated for input range max(sum(x))/2 to max(sum(x)), wherein the sum(x) is a summation of an input vector of the input signal. Since the sum(x) should be pre-calculated, by selecting the corresponding circuit with G' optimized for the range of sum(x), a better computing accuracy may be achieved.

Figure 4:
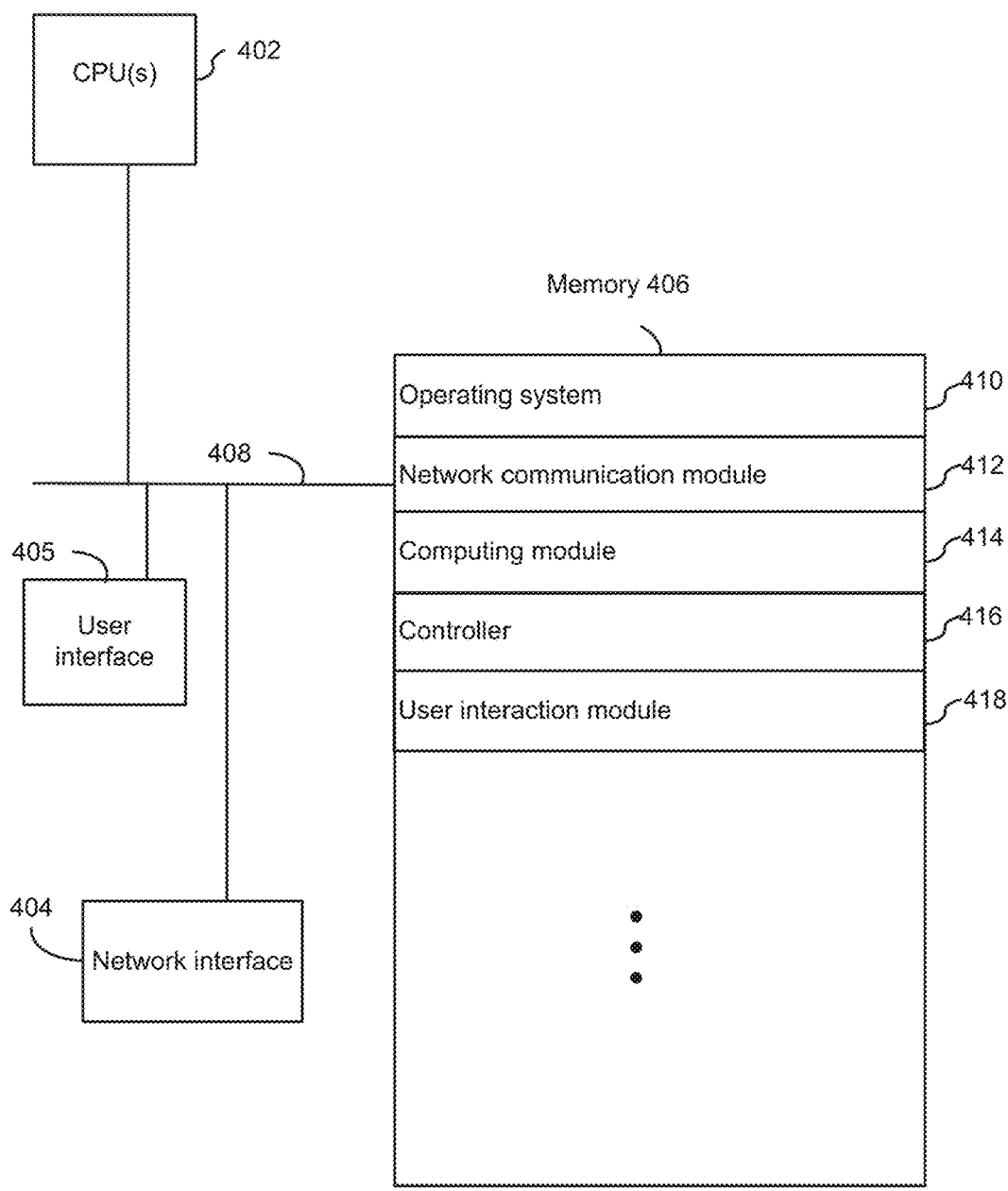
FIG. 4 is a block diagram illustrating an example computing system for implementing a method of improving computing accuracy on a memristor crossbar in accordance with some implementations.

FIG. 4 is a block diagram illustrating an example computing system 400 for implementing a memristor crossbar for improving computing accuracy in accordance with some implementations.

The computer system 400 may be used to at least the crossbars, crossbar arrays, or in-line arrays and methods shown with references to FIGS. 1-3. The computer system 400 in some implementations includes one or more processing units CPU(s) 402 (also referred to as processors 402), one or more network interfaces, optionally a user interface 405, a memory 406, and one or more communication buses 408 for interconnecting these components. The communication buses 408 optionally include circuitry (sometimes called a chipset) that interconnects and controls communications between system components. The memory 406 typically includes high-speed random access memory, such as DRAM, SRAM, DDR RAM or other random access solid state memory devices; and optionally includes non-volatile memory, such as one or more magnetic disk storage devices, optical disk storage devices, flash memory devices, or other non-volatile solid state storage devices. The memory 406 optionally includes one or more storage devices remotely located from the processors 402. The memory 406, or alternatively the non-volatile memory device(s) within the memory 406, includes a non-transitory computer readable storage medium. In some implementations, the memory 406 or alternatively the non-transitory computer readable storage medium stores the following programs, modules, and data structures, or a subset thereof:

- an operating system 410 (e.g., an embedded Linux operating system), which includes procedures for handling various basic system services and for performing hardware dependent tasks;
- a network communication module 412 for connecting the computer system with a manufacturing machine via one or more network interfaces (wired or wireless);
- a computing module 414 for executing programming instructions;
- a controller 416 for controlling a manufacturing machine in accordance with the execution of programming instructions; and
- A user interaction module 418 for enabling a user to interact with the computer system 400, for example, through the user interface 405.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
   a first column of crossbar devices;
   a second column of crossbar devices;
   a plurality of analog to digital converters (ADCs) configured to receive an input signal from the first column of crossbar devices and the second column of crossbar devices;
   a selector configured to switch the input signal between the first column of crossbar devices and the second column of crossbar devices; and
   a CPU configured to calculate a first conductance of the first column of crossbar devices and a second conductance of the second column of crossbar devices, wherein the selector is configured to switch the signals between the first column of crossbar devices and the second column of crossbar devices in accordance with the first conductances and the second conductances.

2. The apparatus as claimed in claim 1, further comprising a storage configured to save signals from the plurality of ADCs.

3. The apparatus as claimed in claim 1, wherein the selector is further configured to switch in accordance with a determination of which conductance of a column of crossbar devices approximates to an optimal conductance.

4. The apparatus as claimed in claim 3, wherein the optimal conductance is an average conductance of the first conductance and the second conductance.

5. The apparatus as claimed in claim 1, further comprising a plurality of columns of crossbar devices, wherein the first column of crossbar devices and the second column of crossbar devices are located at a farthest end of the plurality of columns of crossbar devices away from the input signal.

6. The apparatus as claimed in claim 1, wherein at least one crossbar device in the plurality of first column of crossbar devices and the plurality of second column of crossbar devices is one of: a memristor, a memristive, a Pulse-Code Modulation (PCM) device, a floating date, a phase change device, a Resistive Random-Access Memory (RRAM or ReRAM), a Magnetoresistive Random-Access Memory (MRAM), a Dynamic random-access memory (DRAM), and a Static Random-Access Memory (static RAM or SRAM).

7. The apparatus as claimed in claim 1, wherein the selector comprises a multiplexer or a transistor.

8. A method comprising:
   selecting a plurality of reading voltage as an input signal before programming an apparatus, wherein the apparatus includes:
      a crossbar array configured to receive the input signal, wherein the crossbar array comprises:
         a first column of crossbar devices;
   using a conversion algorithm to find a mapping conductance G', that I=V⊙G=crossbarsim(G', V);
   calculating a plurality of mapping conductance G' of the first column of crossbar devices based on the plurality of reading voltage;
   calculating an average mapping conductance Gavg, that Gavg=average(G'1, G'2, . . . , G'n);
   programming the crossbar array with a programming signal calibrated with the average mapping conductance Gavg; and
   using the crossbar array for computing.

9. The method as claimed in claim 8,
wherein the crossbar array further comprises:
a second column of crossbar devices; and
wherein the apparatus further comprises:
a plurality of analog to digital converters (ADCs) configured to receive the input signal from the first column of crossbar devices and the second column of crossbar devices;
a selector configured to switch the input signal between the first column of crossbar devices and the second column of crossbar devices; and
a CPU configured to calculate a first conductance of the first column of crossbar devices and a second conductance of the second column of crossbar devices, wherein the selector is configured to switch the signals between the first column of crossbar devices and the second column of crossbar devices in accordance with the first conductances and the second conductances.

10. The method as claimed in claim 9, wherein the first conductance of the first column of crossbar devices is calibrated for input range 0 to max(sum(x))/2, and the second conductance of the second column of crossbar devices is calibrated for input range max(sum(x))/2 to max(sum(x)), wherein the sum(x) is a summation of an input vector of the input signal.

11. A non-transitory computer-readable storage medium storing one or more programs, the one or more programs comprising instructions, which when executed by a computing system with one or more processors, cause the computing system to execute a method of:
selecting a plurality of reading voltage as an input signal before programming an apparatus, wherein the apparatus includes:
a crossbar array configured to receive the input signal, wherein the crossbar array comprises:
a first column of crossbar devices;
using a conversion algorithm to find a mapping conductance G', that I=V⊙G=crossbarsim(G', V);
calculating a plurality of mapping conductance G' of the first column of crossbar devices based on the plurality of reading voltage;
calculating an average mapping conductance Gavg, that Gavg=average(G'1, G'2, . . . , G'n);
programming the crossbar array with a programming signal calibrated with the average mapping conductance Gavg; and
using the crossbar array for computing.

12. The non-transitory computer-readable storage medium as claimed in claim 11,
wherein the crossbar array further comprises:
a second column of crossbar devices; and
wherein the apparatus further comprises:
a plurality of analog to digital converters (ADCs) configured to receive the input signal from the first column of crossbar devices and the second column of crossbar devices;
a selector configured to switch the input signal between the first column of crossbar devices and the second column of crossbar devices; and
a CPU configured to calculate a first conductance of the first column of crossbar devices and a second conductance of the second column of crossbar devices, wherein the selector is configured to switch the signals between the first column of crossbar devices and the second column of crossbar devices in accordance with the first conductances and the second conductances.

13. The non-transitory computer-readable storage medium as claimed in claim 12, wherein the first conductance of the first column of crossbar devices is calibrated for input range 0 to max(sum(x))/2, and the second conductance of the second column of crossbar devices is calibrated for input range max(sum(x))/2 to max(sum(x)), wherein the sum(x) is a summation of an input vector of the input signal.

\* \* \* \* \*